United States Patent [19]

Yang et al.

[11] Patent Number: 5,393,702
[45] Date of Patent: Feb. 28, 1995

[54] VIA SIDEWALL SOG NITRIDATION FOR VIA FILLING

[75] Inventors: Ming-Tzung Yang, Hsin Chu; Hong-Tsz Pan, Chang-Hua; Shih-Chanh Chang, Taichung, all of Taiwan, Prov. of China

[73] Assignee: United Microelectronics Corporation, Hsinchu, Taiwan, Prov. of China

[21] Appl. No.: 85,955

[22] Filed: Jul. 6, 1993

[51] Int. Cl.$^6$ .................... H01L 29/34; H01L 21/44
[52] U.S. Cl. .................... 437/195; 437/231; 437/235; 437/242; 257/637; 257/639; 257/640; 257/641; 257/649
[58] Field of Search ............... 257/637, 639, 640, 641; 257/649, 650; 437/195, 232, 235, 241; 148/DIG. 114

[56] References Cited

U.S. PATENT DOCUMENTS

| | | | |
|---|---|---|---|
| 4,641,420 | 2/1987 | Lee | 257/774 |
| 4,812,201 | 3/1989 | Sakai et al. | 156/643 |
| 4,980,307 | 12/1990 | Ito et al. | 437/40 |
| 5,003,062 | 3/1991 | Yen | 437/231 |
| 5,100,820 | 3/1992 | Tsubone | 257/344 |
| 5,177,588 | 1/1993 | Ii et al. | 257/640 |
| 5,186,745 | 2/1993 | Maniar | 106/287.16 |
| 5,270,267 | 12/1993 | Ouellet | 437/231 |

FOREIGN PATENT DOCUMENTS

| | | | |
|---|---|---|---|
| 62-221120 | 9/1987 | Japan | 457/231 |
| 1-192137 | 8/1989 | Japan | |

OTHER PUBLICATIONS

S. M. Sze, *Semiconductor Devices Physics and Technology*, John Wiley & Sons, New York 1985, p. 362.

Full English translation of Konno, Reference L of Paper No. 3.
*IBM Technical Disclosure Bulletin*, vol. 30 No. 8 (Jan. 1988), "Nitride Sidewall Spacers Used as a Contamination Barrier", pp. 295–296.
"Hot Carrier Aging of the MOS Transistor in the Presence of Spin-On-Glass as the Interlevel Dielectric" by Lifshite et al, *IEEE Electron Device Letters*, vol. 12, No. 3, Mar. 1991, pp. 140–142.
"Field Inversion Leakage in CMOS Double Metal Circuits Due to Carbon Based SOGs" by Pramanik et al, 1989 *IEEE VMIC Conf.* Jun. 12–13, 1989, pp. 454–458.

*Primary Examiner*—J. Carroll
*Attorney, Agent, or Firm*—George D. Saile

[57] ABSTRACT

A new method of forming the dielectric layer of an integrated circuit is described. A thick insulating layer is formed over semiconductor device structures in and on a semiconductor substrate. A first metal layer is deposited over the thick insulating layer. The first metal layer is etched using conventional photolithography and etching techniques to form the desired metal pattern on the surface of the thick insulating layer. The intermetal dielectric layer is formed by first covering the patterned first metal layer with a layer of silicon oxide. The silicon oxide layer is covered with a layer of spin-on-glass material which is baked and cured. A second layer of silicon oxide completes the intermetal dielectric layer. Via openings are formed through the intermetal dielectric layer to the underlying patterned first metal layer. A silicon nitride cap is formed on the exposed surfaces of the spin-on-glass layer within the via openings to prevent outgassing from the intermetal dielectric layer, and thus to prevent poisoned via metallurgy. A second metal layer is deposited overlying the intermetal dielectric layer and within the via openings and fabrication of the integrated circuit is completed.

11 Claims, 2 Drawing Sheets

VIA SIDEWALL SOG NITRIDATION FOR VIA FILLING

BACKGROUND OF THE INVENTION (1) Field of the Invention

The invention relates to a method of forming a silicon nitride material cap upon a spin-on-glass silicon oxide layer, and more particularly, to a method of forming a spin-on-glass intermetal dielectric layer with nitridation to prevent poisoned via metallurgy in the fabrication of integrated circuits.

(2) Description of the Prior Art

The spin-on-glass materials have been used for planarization of integrated circuits. The material to be applied is thoroughly mixed in a suitable solvent. The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is driven off by a low temperature baking step often followed by vacuum degassing. Other coatings of the spin-on-glass material are applied, baked and vacuum degassed until the desired spin-on-glass layer is formed.

The final step in the making of the spin-on-glass layer is curing. Curing is a high temperature heating step to cause the breakdown of the silicate or siloxane material to a silicon dioxide like cross linked material. A cured spin-on-glass process is described in U.S. Pat. No. 5,003,062 to Yen.

In the conventional etchback process as taught by Yen U.S. Pat. No. 5,003,062, the spin-on-glass layer is etched back resulting in a poisoned via metallurgy, such as aluminum, caused by outgassing. When a via opening is made through the spin-on-glass, leaving a portion of the spin-on-glass exposed, there may be outgassing of water from the spin-on-glass layer. This water reacts with the aluminum causing corrosion of the aluminum. When etchback is not used, poisoned via metallurgy occurs especially in small via sizes.

The use of a silicon nitride cap on spin-on-glass has been suggested to avoid various problems. "Hot-Carrier Aging of the MOS Transistor in the Presence of Spin-On Glass as the Interlevel Dielectric" by Lifshitz et al, IEEE Electron Device Letters, Vol. 12, No. 3, March 1991, pp.140–142, suggests the use of a silicon nitride cap on the cured spin-on-glass to overcome aging of the MOS transistor. "Field Inversion Leakage in CMOS Double Metal Circuits Due to Carbon Based SOGs" by Pramanik et al, 1989 IEEE VMIC Conference, Jun. 12-13, 1989 pp.454–458, suggests the use of an oxide or nitride film that does not liberate hydrogen gas leading to failure of devices. JA Application 1-192137 dated August 1989 to Shigeki Kimura describes the deposition of an insulating film on the exposed regions of an intermetal cured spin-on-glass layer within a via.

Nitridation of silicon oxide layers is known as shown by U.S. Pat. No. 4,980,307 to T. Ito et al. However, Ito et al requires the use of high temperature in the order of 800° to 1300° C. to accomplish his nitridation of the silicon oxide layer to form a silicon nitride surface layer.

SUMMARY OF THE INVENTION

A principal object of the present invention is to provide an effective and very manufacturable method of forming the intermetal dielectric layer of an integrated circuit.

Another object of the invention is to form a silicon nitride material cap upon a layer of spin-on-glass silicon oxide.

Another object of the present invention is to provide a method of forming the intermetal dielectric layer of an integrated circuit which does not result in poisoned via metallurgy.

In accordance with the objects of this invention a new method of forming the dielectric layer of an integrated circuit is achieved. A thick insulating layer is formed over semiconductor device structures in and on a semiconductor substrate. A first metal layer is deposited over the thick insulating layer. The first metal layer is etched using conventional photolithography and etching techniques to form the desired metal pattern on the surface of the thick insulating layer. The intermetal dielectric layer is formed by first covering the patterned first metal layer with a layer of silicon oxide. The silicon oxide layer is covered with a layer of spin-on-glass material which is baked and cured. A second layer of silicon oxide completes the intermetal dielectric layer. Via openings are formed through the intermetal dielectric layer to the underlying patterned first metal layer. A silicon nitride cap is formed on the exposed surfaces of the spin-on-glass layer within the via openings to prevent outgassing from the intermetal dielectric layer, and thus to prevent poisoned via metallurgy. A second metal layer is deposited overlying the intermetal dielectric layer and within the via openings and fabrication of the integrated circuit is completed.

A further method is described which includes forming a silicon nitride material cap upon a spin-on-glass layer. The method begins by depositing a spin-on-glass layer upon a substrate. The spin-on-glass layer is baked and cured to form a spin-on-glass silicon oxide layer. These is now formed a silicon nitride material cap on the exposed surfaces of the spin-on-glass silicon oxide layer by exposing the spin-on-glass layer to nitrogen atoms, such as ionized ammonia or the like at a temperature of less than about 550° C.

BRIEF DESCRIPTION OF THE DRAWINGS

In the accompanying drawings forming a material part of this description, there is shown.

DESCRIPTION OF THE PREFERRED EMBODIMENTS

Figure 1:
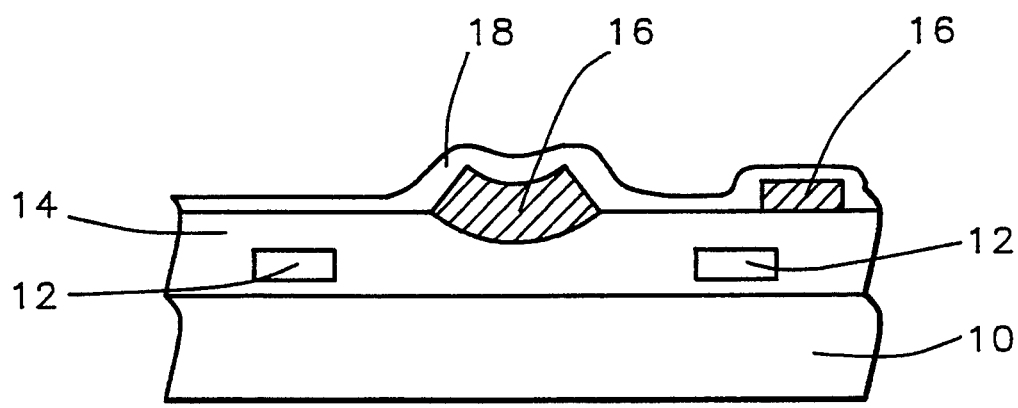
FIGS. 1 through 5 schematically illustrate in cross-sectional representation one preferred embodiment of the present invention.

Referring now more particularly to FIG. 1, there is shown a portion of a partially completed integrated circuit. The semiconductor substrate 10 is preferably composed of monocrystalline silicon. A layer of polysilicon is deposited and patterned using photolithography and etching techniques to form gate electrode patterns 12. A thick passivation or insulating layer 14 is then formed over the surfaces of the patterns. This layer may be composed of borophosphosilicate glass, phosphosilicate glass or similar insulating layer. The operational thickness of the insulating layer is between about 2000 to 10,000 Angstroms.

A metal 16 is sputter deposited over the surface of the insulating layer 14. This metal may be AlSiCu. The metal layer is patterned using conventional photolithography and etching techniques to form the metal pattern shown in FIG. 1. A conformal layer of silicon oxide 18 is deposited using plasma enhanced chemical vapor deposition (PECVD) to a thickness of between about 1000 to 6000 Angstroms. A tetraethoxysilane (TEOS) oxide or other silane-based oxide may be used. This is the first layer of the intermetal dielectric sandwich layer.

Figure 2:
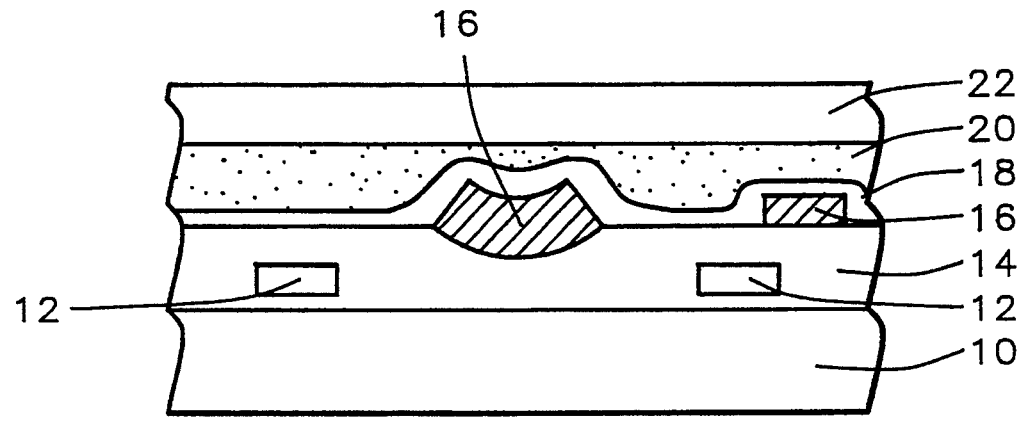

Referring now to FIG. 2, a silicate or siloxane spin-on-glass coating 20 is applied. The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is driven off by a low temperature baking step. A double or triple coating of spin-on-glass could be used if desired. The preferred thickness of the spin-on-glass layer is between about 1000 to 10,000 Angstroms. The spin-on-glass layer is cured at between about 350° to 500° C. for between 5 to 60 minutes. Si—O bonds are formed by the curing process, but some dangling silicon bonds remain which can bond easily with nitrogen.

Finally, the top layer of the spin-on-glass sandwich is deposited. A second layer 22 of silicon oxide is deposited by PECVD to a thickness of between about 1000 to 8000 Angstroms.

Figure 3:
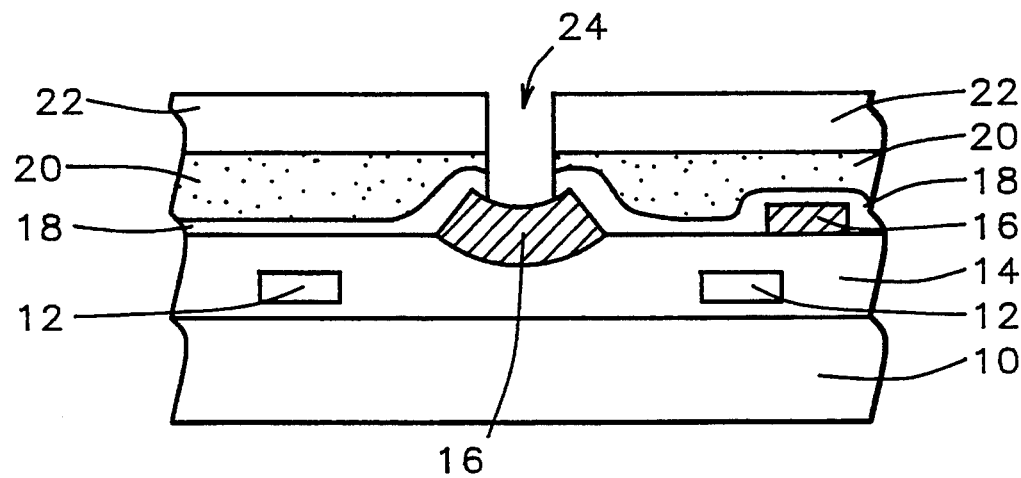
Figure 4:
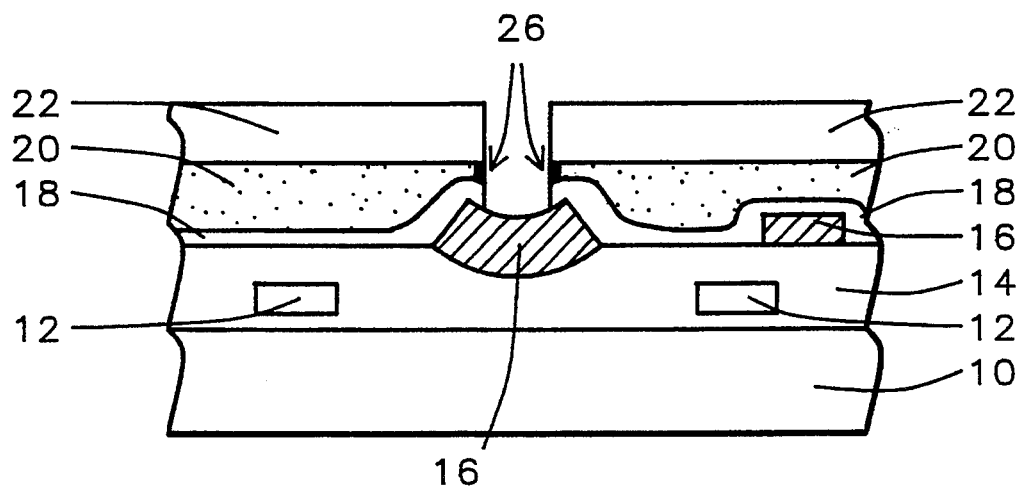

Referring now to FIG. 3, via openings 24 are made through the dielectric layer to the underlying first metal layer. FIG. 4 illustrates the critical low temperature nitridation process of the present invention. The preferred nitrogen atom source is $NH_3$, but $N_2O$ or $N_2$ could also be used. Nitrogen can bond easily with the dangling silicon bonds remaining after the spin-on-glass curing process. This allows a low-temperature nitridation. Nitridation of CVD oxide or thermal oxide requires a high temperature greater than 800° C. In CVD oxide or thermal oxide nitridation, the nitrogen replaces the oxygen of the Si—O bond. In the spin-on-glass nitridation of the present invention, nitrogen bonds with the dangling silicon bonds or with the weaker Si—OH bonds in silicate spin-on-glass or the weaker Si—OCH$_3$ bonds in siloxane spin-on-glass.

The nitridation is performed as a rapid thermal process (RTP) in which the temperature is rapidly run up and down or it is performed in a furnace at a temperature of between about 300° to 600° C. for a duration of between about 10 minutes to two hours. The result of the nitridation process is a silicon nitride material film 26 on the exposed surfaces of the spin-on-glass material within the via openings. The cap is composed of a $Si_xN_yO_z$ material.

Figure 5:
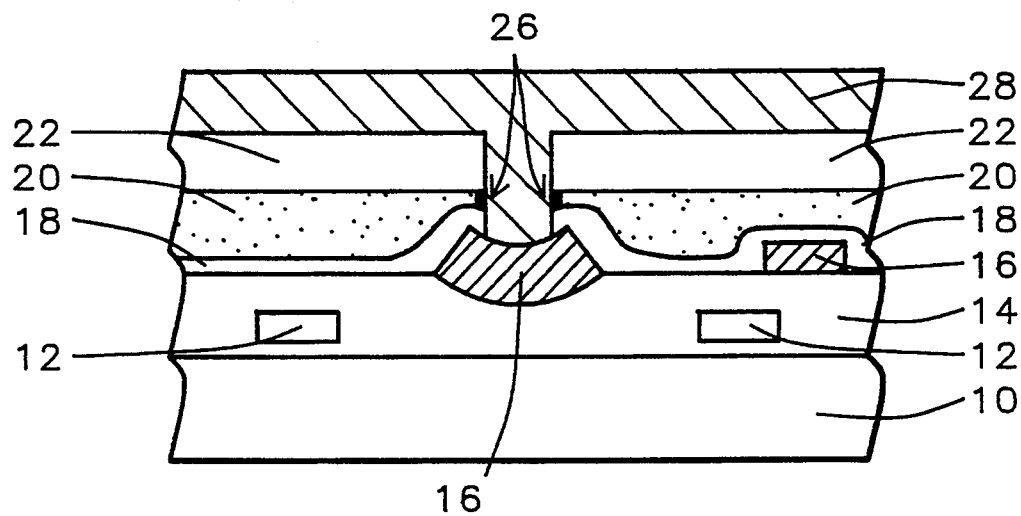
Figure 6:
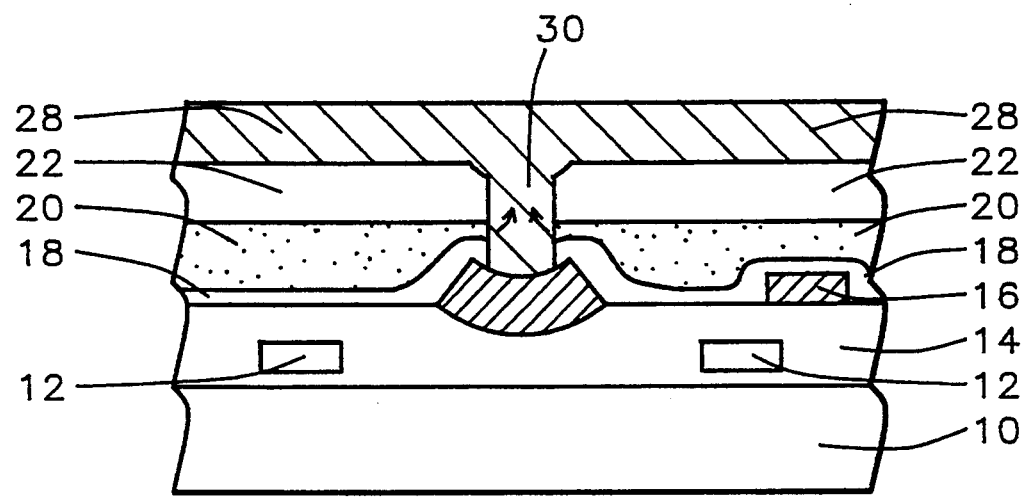
FIG. 6 schematically illustrates in cross-sectional representation a partially completed integrated circuit indicating the outgassing problem of the prior art.

Referring now to FIG. 5, the second metallurgy 28 is sputter deposited over the surface of the wafer and within the via openings to make contact with the first metal layer 16. The silicon nitride material film 26 covering the spin-on-glass layer within the via openings prevents the outgassing of water from the spin-on-glass layer. Referring to FIG. 6 of the prior art without the silicon nitride film, outgassing 30 occurs into the second metal layer 30 causing poisoned via metallurgy. The process of the invention prevents poisoned via metallurgy.

While the invention has been particularly shown and described with reference to the preferred embodiments thereof, it will be understood by those skilled in the art that various changes in form and details may be made without departing from the spirit and scope of the invention.

What is claimed is:

1. The method of forming the intermetal dielectric layer of an integrated circuit while preventing outgassing from said intermetal dielectric layer comprising:
   providing a thick insulating layer over semiconductor device structures in and on a semiconductor substrate;
   depositing a first metal layer over said thick insulating layer;
   etching said first metal layer using photolithography and etching techniques to form the desired metal pattern on the surface of said thick insulating layer;
   forming said intermetal dielectric layer comprising:
   covering said patterned first metal layer with a first layer of silicon oxide;
   covering said first silicon oxide layer with a layer of spin-on-glass material and baking and curing said spin-on-glass layer to form a spin-on-glass silicon oxide layer; and
   covering said spin-on-glass layer with a second layer of silicon oxide to complete said intermetal dielectric layer;
   forming via openings through said intermetal dielectric layer to underlying said patterned first metal layer which thereby exposes portions of said spin-on-glass silicon oxide layer;
   forming a silicon nitride material cap of between about 50 to 200 Angstroms on the said exposed surfaces of said spin-on-glass silicon oxide layer within said via opening by exposing said spin-on-glass layer to nitrogen atoms at a temperature of between about 450° to 600° C. to prevent said outgassing from said intermetal dielectric layer;
   depositing a second metal layer overlying said intermetal dielectric layer and within said via openings; and
   completing fabrication of said integrated circuit.

2. The method of claim 1 wherein said first and second silicon oxide layers are deposited by plasma enhanced chemical vapor deposition to a preferred thickness of between about 1000 to 8000 Angstroms.

3. The method of claim 1 wherein said spin-on-glass material has a preferred thickness of between about 1000 to 10,000 Angstroms.

4. The method of claim 1 wherein said silicon nitride material cap is formed by reacting the exposed said cured spin-on-glass silicon oxide using $NH_3$ as the nitrogen source.

5. The method of claim 4 wherein said reacting is done by rapid thermal processing for a duration of between about 10 minutes to two hours.

6. The method of forming the intermetal dielectric layer of an integrated circuit while preventing outgassing from said intermetal dielectric layer comprising:
   depositing a layer of polysilicon over the surface of a semiconductor substrate;
   etching said polysilicon layer using photolithography and etching techniques to form the desired pattern of gate electrodes on the surface of said semiconductor substrate;
   covering said pattern of gate electrodes with a thick insulating layer;

depositing a first metal layer over said thick insulating layer;

etching said first metal layer using photolithography and etching techniques to form the desired metal pattern on the surface of said thick insulating layer;

forming said intermetal dielectric layer comprising:

covering said patterned first metal layer with a first layer of silicon oxide;

covering said first silicon oxide layer with a layer of spin-on-glass material, and baking and curing said spin-on-glass layer to form a spin-on-glass silicon oxide layer; and covering said spin-on-glass silicon oxide layer with a second layer of silicon oxide to complete said intermetal dielectric layer;

forming via openings through said intermetal dielectric layer to underlying said patterned first metal layer which thereby exposes portions of said spin-on-glass silicon oxide;

forming a silicon nitride material cap of between about 50 to 200 Angstroms on the said exposed surfaces of said spin-on-glass silicon oxide layer within said via opening by exposing said spin-on-glass layer to nitrogen atoms at a temperature of between about 450° to 550° C. to prevent said outgassing from said intermetal dielectric layer;

depositing a second metal layer overlying said intermetal dielectric layer and within said via openings; and completing fabrication of said integrated circuit.

7. The method of claim 6 wherein said thick insulating layer is composed of borophosphosilicate glass.

8. The method of claim 6 wherein said first and second silicon oxide layers are deposited by plasma enhanced chemical vapor deposition to a preferred thickness of between about 1000 to 8000 Angstroms.

9. The method of claim 6 wherein said spin-on-glass material has a preferred thickness of between about 1000 to 10,000 Angstroms.

10. The method of claim 9 wherein said spin-on-glass silicon oxide layer has some dangling silicon bonds after said curing wherein said dangling silicon bonds can bond easily with said nitrogen atoms.

11. The method of claim 6 wherein said silicon nitride material cap is formed by reacting the exposed said cured spin-on-glass using $NH_3$ as the nitrogen source.

* * * * *